United States Patent [19]

Rumbaugh

[11] 4,081,757
[45] Mar. 28, 1978

[54] PARALLEL POWER AMPLIFIER CIRCUITS

[75] Inventor: Paul S. Rumbaugh, Santa Ana, Calif.

[73] Assignee: Altec Corporation, Anaheim, Calif.

[21] Appl. No.: 743,525

[22] Filed: Nov. 19, 1976

[51] Int. Cl.$^2$ .............................................. H03F 3/68
[52] U.S. Cl. .................................. 330/124 R; 330/84; 330/295
[58] Field of Search .................... 330/30 R, 84, 124 R

[56] References Cited

U.S. PATENT DOCUMENTS

| | | | |
|---|---|---|---|
| 3,350,571 | 10/1967 | Moulton et al. | 330/124 R X |
| 3,885,220 | 5/1975 | Fluegal | 330/30 R |

Primary Examiner—Lawrence J. Dahl
Attorney, Agent, or Firm—Edward A. Sokolski

[57] ABSTRACT

A plurality of similar power amplifier circuits are connected in parallel in the output of an amplifier between the amplifier's voltage amplifier circuit and the load. Each of these amplifier circuits has a similar ballasting resistor connected between its output and the load. The amplifier circuits have unity closed loop voltage gain. The value of the ballasting resistors is empirically chosen such that these resistors are capable of accommodating differences in the outputs of the amplifier circuits which may occur, such that the load is equally shared between the amplifier circuits.

3 Claims, 1 Drawing Figure

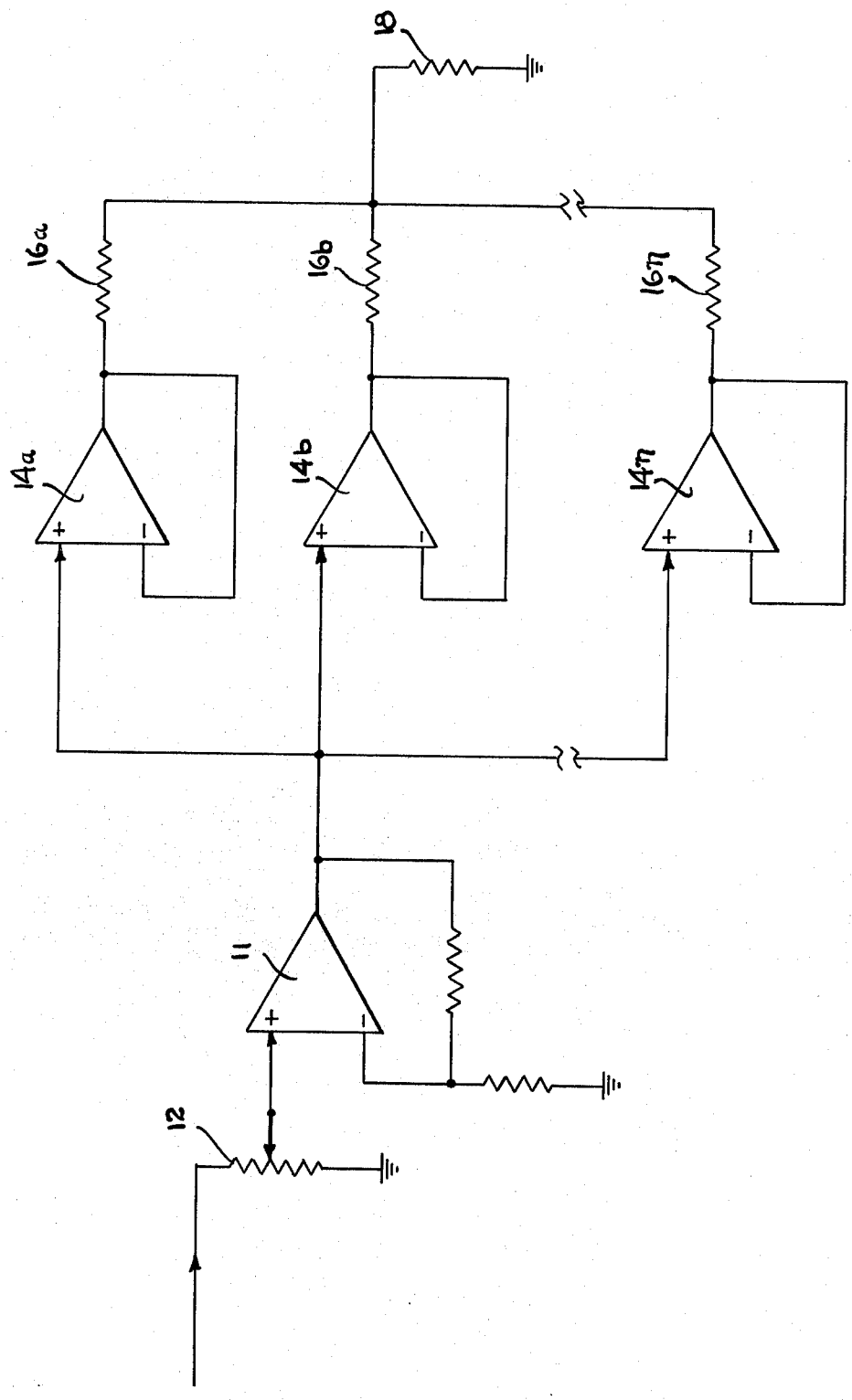

PARALLEL POWER AMPLIFIER CIRCUITS

This invention relates to electronic amplifiers, and more particularly to paralleled power output circuits for such amplifiers.

To enhance reliability in power amplifiers, particularly in commercial usages such as in theater, auditorium, stadium sound systems etc., the power drive circuits of such amplifiers generally include a plurality of similar redundant circuits connected in parallel. Thus, should one or more of such output circuits fail, the systems can still continue to operate until repairs can be effected. A significant shortcoming of such prior art system is their inability to provide for equal sharing of the load between the paralleled power amplifier circuits. It has been found that the open loop gains of similarly designed amplifier circuits can vary as much as 10 to 1, particularly after such circuits have been in use for some time, this variation occurring due to changes in component values and the characteristics of the active amplifying elements themselves. The failure to account for such variations in amplifiers of the prior art can result in an overloading of some of the circuits, which could result in overheating and failure of these circuits.

The present invention provides means for overcoming the aforementioned shortcomings of the prior art such that substantially equal sharing of the load between the paralleled amplifier circuits is afforded.

It is therefore an object of this invention to provide an improved parallel power amplifier circuit arrangement for power amplifiers, such as used in sound systems.

Other objects of this invention will become apparent as the description proceeds in connection with the sole drawing.

The sole FIGURE is a schematic drawing of a preferred embodiment of the invention.

Briefly described, the invention is as follows:

A plurality of similar power amplifier circuits, each of which has unity closed loop voltage gain, are connected in parallel with each other between a voltage amplifier and a load which may comprise a voice coil or voice coils of one or more loudspeakers, the drive circuit of a servomechanism, etc. Connected between the load and each power amplifier circuit is a ballasting resistor, these resistors all having equal values, the magnitude of this value being determined empirically so as to afford equal sharing of the load between the amplifiers despite substantial differences in the open loop gains of the various power amplifier circuits. The value of the isolating resistor is generally of the order of ½% of the rated load impedance per amplifier, this value being accurately determined by an empirically derived equation.

Referring now to sole FIGURE, a preferred embodiment of the invention is schematically illustrated. Voltage amplifier 11 receives an input from voltage control 12 and provides an output to each of power amplifier circuits 14a–14n. It is to be noted that the number of power amplifier circuits 14a–14n utilized may vary in accordance with application requirements, there being typically anywhere from 2 to 10 such circuits. The outputs of amplifier circuits 14a–14n are connected to load 18 through respective ballasting resistors 16a–16n. Load 18 may comprise a voice coil of one or more loudspeakers. Experience has indicated that with values for each of ballasting resistors 16a–16n of about ½% of the effective load per amplifier ($nR_L$), the desired end results can be achieved, namely that the load will be shared substantially equally between all of amplifiers 14a–14n.

A precise value, $R_b$, can be determined for the ballasting resistors 16a–16n from the following empirically derived equation:

$$R_b = \frac{nR_L(K_1 - K_2)}{\delta K_1 K_2} \quad (1)$$

where $R_L$ = the resistance of load 18,
$n$ = number of amplifiers sharing load 18,
$K_1$ = the highest open loop voltage gain that could possibly be anticipated for any of amplifier circuits 14a–14n,
$K_2$ = the lowest open loop voltage gain that could be anticipated for any of amplifier circuits 14a–14n, and $$\delta = \frac{I_1 - I_2}{\frac{1}{2}(I_1 + I_2)} \quad (2)$$

where $I_1$ = the highest current that would be desired for any of the power amplifier circuits, and
$I_2$ = the lowest current that would be desired for any of the power amplifier circuits.

The following example will illustrate a typical design. The following values were specified for this typical design: $K_2 = 767$; $K_1 = 7670$; $I_1 = 1.1A$; $I_2 = 0.9A$; $R_L = 5$ ohms; $n = 3$. A substituting in equation (2) gives a value of $\delta$ of 0.2.

Substituting the above indicated values in equation (1) gives a value for $R_b$ of 0.088 ohms.

While the invention has been described and illustrated in detail, it is to be clearly understood that this is intended by way of illustration and example only and is not to be taken by way of limitation, the spirit and scope of this invention being limited only by the terms of the following claims.

I claim:

1. An amplifier for providing power to a load comprising:
   a voltage amplifier circuit;
   a plurality of similar power amplifier circuits connected in parallel with each other between the voltage amplifier circuit and the load, each of said circuits being connected in a closed loop configuration to have unity voltage gain, and
   a similar ballasting resistor connected between the output of each of the power amplifier circuits and the load, the resistance of said resistors being such as to provide substantially equal sharing of the load between said power amplifier circuits even with substantially different open loop gains in the amplifier circuits.

2. The amplifier of claim 1 wherein the resistance of each of said ballasting resistors is substantially equal to ½% of $n \times R_L$, where $n$ is the number of said power amplifier circuits and $R_L$ is the resistance of the load.

3. The amplifier of claim 1 wherein the resistance, $R_b$, of each of said ballasting resistors is defined by the equation:

$$R_b = \frac{nR_L(K_1 - K_2)}{\delta K_1 K_2}$$

where $R_L$ = resistance of the load, $n$ = number of power amplifier circuits, $K_1$ = the highest open loop voltage gain that could be anticipated for any of the power amplifier circuits, $K_2$ = the lowest open loop voltage gain that could be anticipated for any of the power amplifier circuits, and $$\delta = \frac{I_1 - I_2}{\frac{1}{2}(I_1 + I_2)}$$

where $I_1$ = the highest current that would be desired for any of the power amplifier circuits, and $I_2$ = the lowest current that would be desired for any of the power amplifier circuits.

* * * * *

REEXAMINATION CERTIFICATE (32nd)

United States Patent [19]
Rumbaugh

[11] B1 4,081,757
[45] Certificate Issued Nov. 2, 1982

[54] PARALLEL POWER AMPLIFIER CIRCUITS

[75] Inventor: Paul S. Rumbaugh, Santa Ana, Calif.

[73] Assignee: Altec Corporation, Anaheim, Calif.

Reexamination Request
No. 90/000,048, Aug. 7, 1981

Reexamination Certificate for:
Patent No.: 4,081,757
Issued: Mar. 28, 1978
Appl. No.: 743,525
Filed: Nov. 19, 1976

[51] Int. Cl.³ .................... H03F 3/68; H03F 1/34
[52] U.S. Cl. .................. 330/124R; 330/84; 330/295
[58] Field of Search ................... 330/84, 124R, 295

[56] References Cited
OTHER PUBLICATIONS

*Bipolar Power Supply/Amplifier Model 6825A,* Hewlett Packard Co., pp. 1-3, 3-11, title page, March 1974.

*DC Power Supply Handbook,* Hewlett Packard Co., pp. 1, 109, title page, copyright 1970.

*Primary Examiner*—James B. Mullins

[57] ABSTRACT

A plurality of similar power amplifier circuits are connected in parallel in the output of an amplifier between the amplifier's voltage amplifier circuit and the load. Each of these amplifier circuits has a similar ballasting resistor connected between its output and the load. The amplifier circuits have unity closed loop voltage gain. The value of the ballasting resistors is empirically chosen such that these resistors are capable of accommodating differences in the outputs of the amplifier circuits which may occur, such that the load is equally shared between the amplifier circuits.

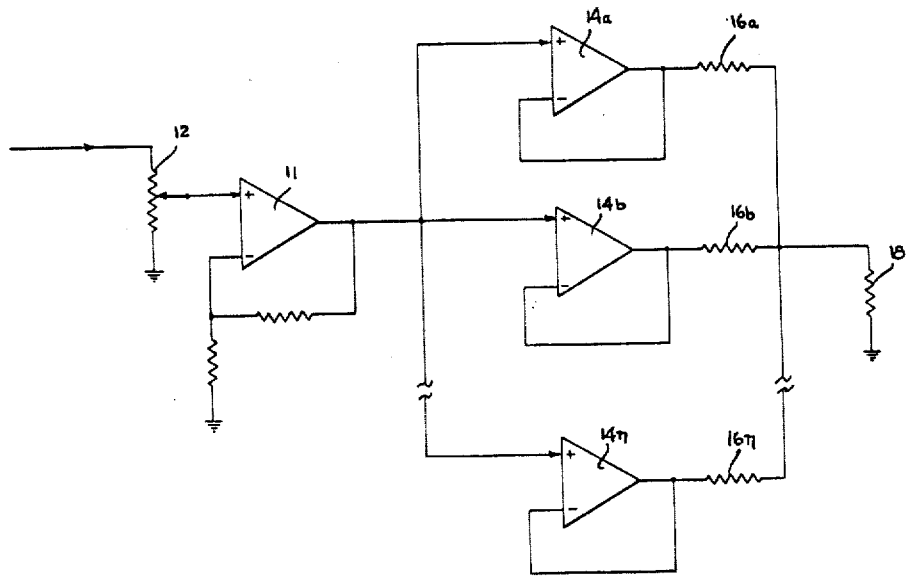

REEXAMINATION CERTIFICATE ISSUED UNDER 35 U.S.C. 307.

THE PATENT IS HEREBY AMENDED AS INDICATED BELOW.

Matter enclosed in heavy brackets appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 2 and 3 is confirmed.

Claim 1 is determined to be patentable as amended:

1. An amplifier for providing power to a load comprising:
   a voltage amplifier circuit;
   a plurality of similar power amplifier circuits connected in parallel with each other between the voltage amplifier circuit and the load, each of said circuits being connected in a closed loop configuration to have unity voltage gain, and
   a similar ballasting resistor connected between the output of each of the power amplifier circuits and the load, the *value of the* resistance of said resistors being *a function of the number of said power amplifier circuits and the resistance of the load* such as to provide substantially equal sharing of the load between said power amplifier circuits even with substantially different open loop gains in the amplifier circuits.

* * * * *